United States Patent [19]

Ong

[11] 4,344,186
[45] Aug. 10, 1982

[54] TUNING CIRCUIT

[75] Inventor: Kian K. Ong, Eindhoven, Netherlands

[73] Assignee: U.S. Philips Corporation, New York, N.Y.

[21] Appl. No.: 182,930

[22] Filed: Sep. 2, 1980

[30] Foreign Application Priority Data

Sep. 3, 1979 [NL] Netherlands ............... 7906578

[51] Int. Cl.$^3$ ............................................. H04B 1/16
[52] U.S. Cl. ................................... 455/168; 455/169; 455/180; 455/195
[58] Field of Search ............... 455/168, 169, 176, 180, 455/188, 195

[56] References Cited

U.S. PATENT DOCUMENTS

| | | | |
|---|---|---|---|
| 3,166,726 | 1/1965 | Jensen et al. | 455/169 |
| 4,249,132 | 2/1981 | Griepentrog | 455/180 |
| 4,249,255 | 2/1981 | Molinari | 455/176 |

Primary Examiner—Marc E. Bookbinder
Attorney, Agent, or Firm—Thomas A. Briody; William J. Streeter; Edward W. Goodman

[57] ABSTRACT

In a tuning circuit for a receiver which is continuously tunable over a number of wave ranges by means of a setting circuit, the receiver having an automatic wave range change-over, the tuning voltage is obtained from a subtracting circuit in which a changeable constant voltage is subtracted from a setting voltage which was obtained by means of the setting circuit, this changeable constant voltage depending on the wave range for adaptation of the wave range limits to the wave range.

5 Claims, 2 Drawing Figures

TUNING CIRCUIT

BACKGROUND OF THE INVENTION

The invention relates to a tuning circuit with automatic wave range change-over, comprising a wave range change-over circuit and a setting circuit for generating a setting signal for consecutively tuning over a number of wave ranges, a threshold circuit to which the said setting signal is applied and from which a d.c. voltage signal which depends on the setting of the tuning is obtained, this d.c. voltage signal having a value which is constant over that wave range and being switchable for each wave range by means of the threshold circuit.

German Patent Specification No. 2,412,689 discloses a tuning circuit of the above-mentioned type wherein there is applied to a tuning diode the tuning signal and also the d.c. voltage signal via a wave range change-over diode and a coil-resistance network. Such a tuning circuit has the advantage that it can scan all wave ranges in one searching action, which is particularly attractive for automatic search tuning circuits. A disadvantage is, however, that a tuning unit to be used in the circuit must be of a special construction which is adapted to the circuit.

SUMMARY OF THE INVENTION

It is an object of the invention to avoid this disadvantage.

According to the invention, a tuning circuit of the type described in the opening paragraph is characterized in that the circuit for providing a tuning signal is a subtracting circuit which is not included in the wave range change-over circuit.

The measure according to the invention results in that only one signal, the tuning signal, must be applied to a tuning terminal of a tuning unit, so that an unadapted tuning unit may be used.

DESCRIPTION OF THE DRAWINGS

The invention will now be further explained with reference to the accompanying drawing figure which comprises FIGS. 1A and 1B in combination and showing a circuit diagram of a television receiver having a tuning circuit according to the invention.

DESCRIPTION OF THE PREFERRED EMBODIMENT

Figure 1A:
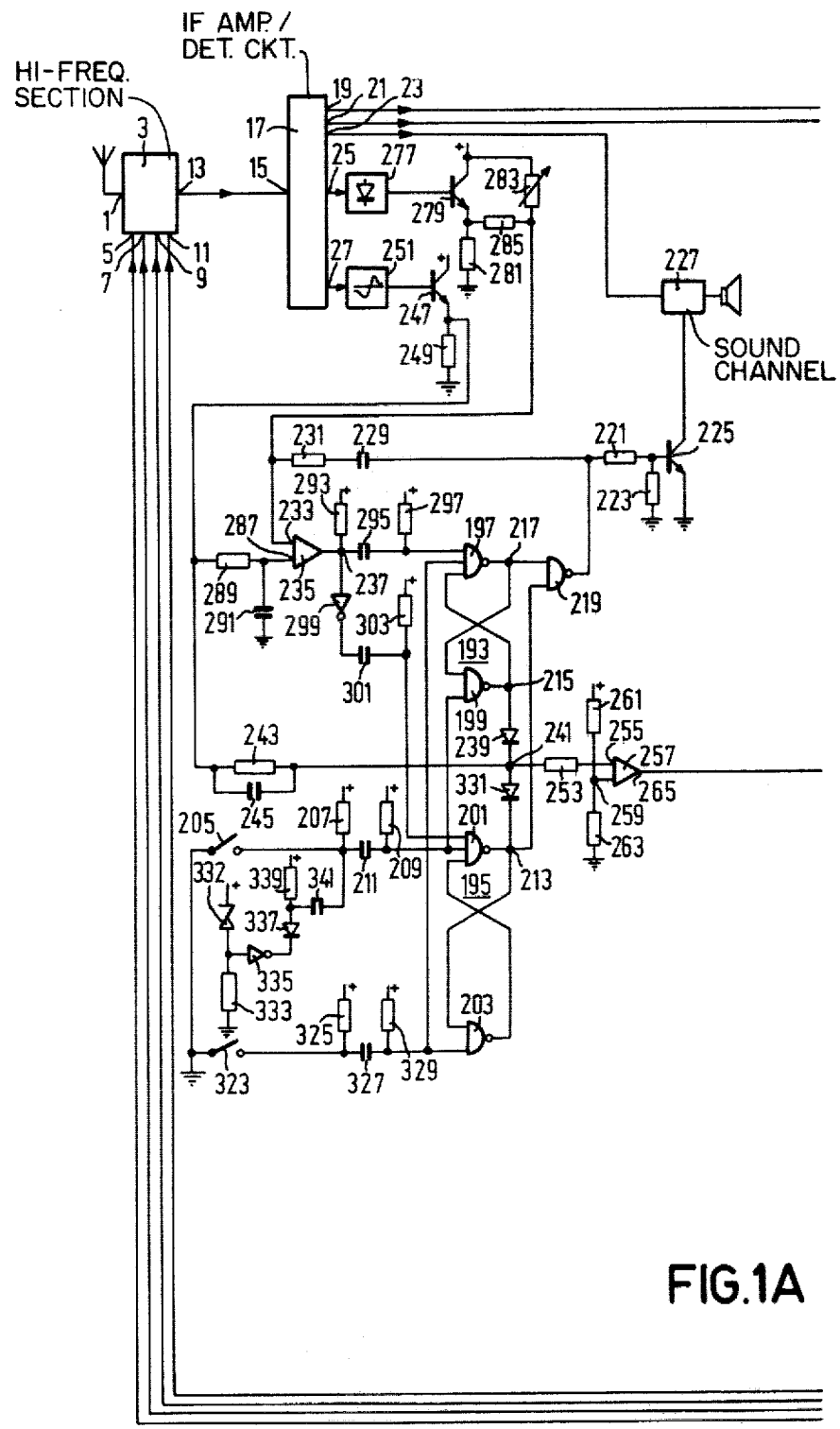
Figure 1B:
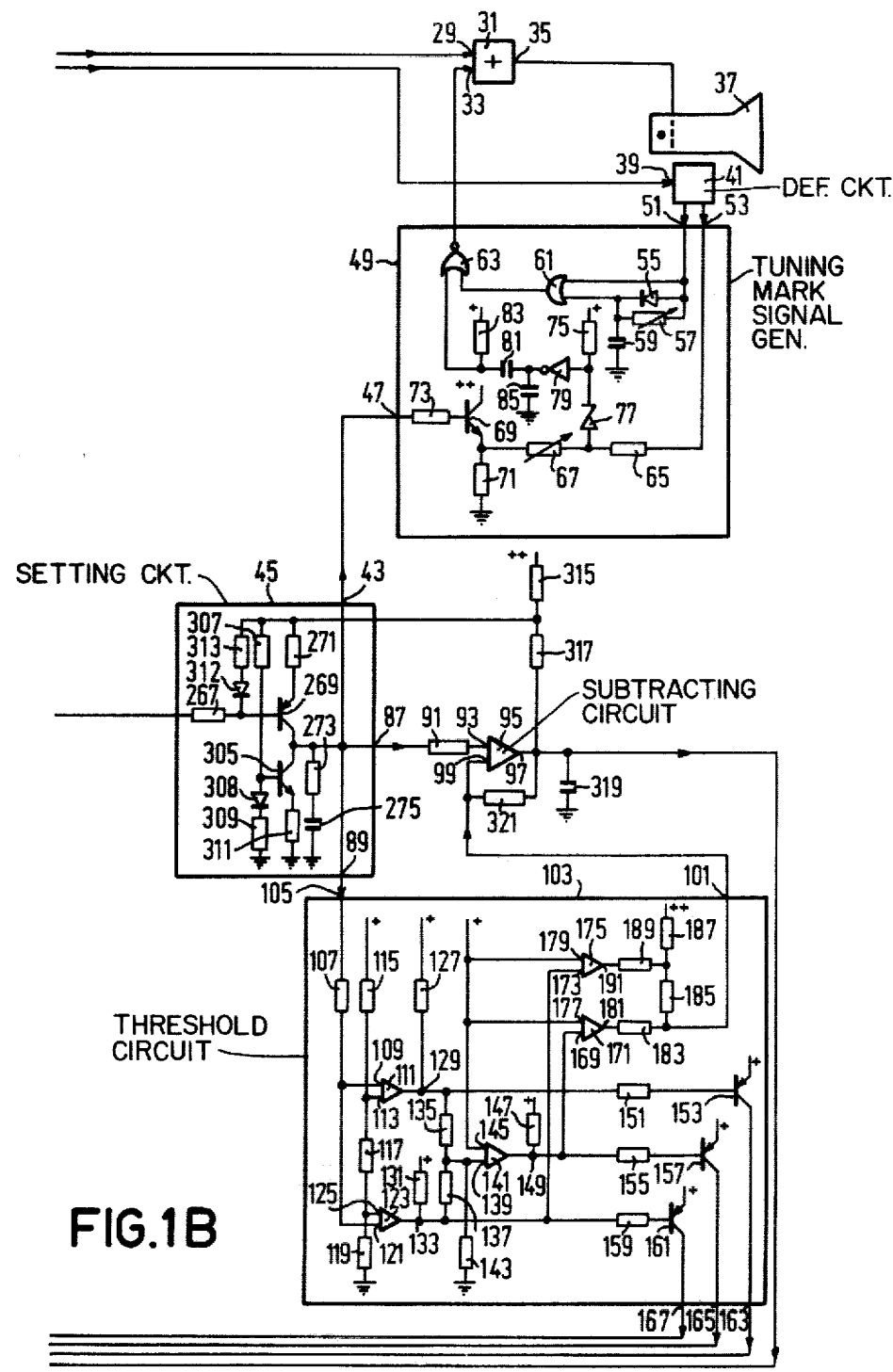

In the Figure, a received signal is applied to an input 1 of a high-frequency section 3. An input 5 of this section 3 receives a tuning signal and three inputs 7, 9, 11 receive a signal combination in response to which, in a wave range change-over circuit contained in the section 3, a wave range is selected in which the high-frequency portion can be tuned by the tuning signal.

At an output 13 of the high-frequency section 3 there appears an intermediate frequency signal, which is applied to an input 15 of an intermediate frequency amplifier and detection circuit 17, which supplies a video signal at an output 19, a synchronizing signal at an output 21, a sound signal at an output 23 and an intermediate frequency signal at two outputs 25 and 27.

The video signal is applied to an input 29 of an adder circuit 31 to a second input 33 of which a tuning mark signal is applied. How this signal is obtained will be explained hereinafter. A sum signal, which is applied to a control electrode of a picture display tube 37 is obtained at an output 35.

The synchronizing signal is applied to an input 39 of a deflection circuit 41 in response to which a picture screen of the picture display tube 37 is scanned.

Not only the video signal but also the tuning mark signal is displayed on the picture screen thus, that a tuning mark appears along the edge of the picture screen, this mark occupying, as will be explained hereinafter, a position which depends on the value of a setting signal. In this way the edge of the picture screen serves as a continuous tuning circuit over all wave ranges.

The said setting signal is obtained from an output 43 of a setting circuit 45 and is applied to an input 47 of a tuning mark signal generator 49, which is further supplied by way of an input 51 with a signal having the horizontal deflection frequency and by way of an input 53 with a signal having the vertical deflection frequency. The signal at the input 51 is high in the retrace periods and low in the line trace periods. This signal is applied directly and through a network comprised of a diode 55, a resistor 57 and a capacitor 59 to an OR-gate 61. In response thereto, the output of the OR-gate 61 becomes low at the end of the trace period and high at the beginning of the retrace period. This signal is applied to an input of a NOR-gate 63 the output of which is connected to the input 33 of the adder circuit 31. The other input of the NOR-gate 63 is supplied with a signal which is low for a short period of time at an instant which occurs with the vertical deflection frequency in the vertical trace period. The signal having the vertical deflection frequency and which is applied to the input 53 is a negative-going sawtooth which is adjusted to a setting signal-dependent d.c. voltage level by means of a circuit comprising two resistors 65, 67 and an emitter follower 69, 71, the input of which is supplied with the setting signal by way of a resistor 73. A zener diode 77 one side of which is connected to the junction point of the resistors 65, 67 and the other end to a positive voltage by way of a resistor 75, starts conducting when the sawtooth voltage becomes sufficiently negative with respect to that positive voltage. Via an amplifier 79 and a differentiating network 81, 83, a negative-going pulse is obtained at an instant of the vertical trace, which instant is determined by the setting signal, so that then a positive-going pulse occurs at the end of the line trace period at the output of the gate 63. The function of a capacitor 85, which is connected to the output of the amplifier 79 is to obtain a pulse shape which is substantially symmetrical so that the tuning mark is given an advantageous shape.

The setting signal does not only appear at the output 43 of the setting circuit 45 but also at an output 87 and an output 89 thereof. By way of a resistor 91 the output 87 applies this setting signal to a non-inverting input 93 of a subtracting circuit 95 an output 97 of which produces the tuning signal applied to the input 5 of the high-frequency section 3. An inverting input 99 of the subtracting circuit 95 is supplied, from an output 101 of a threshold circuit 103, with a d.c. voltage signal, the value of which depends on a wave range which is determined by the setting signal, as will now be explained.

The setting signal at the output 89 of the setting circuit 45 is applied to an input 105 of the threshold circuit 103, which is connected by way of a resistor 107 to an inverting input 109 of a first comparison circuit 111, a non-inverting input 113 thereof being connected to a tap of a voltage divider 115, 117, 119. A non-inverting input 121 of a second comparison circuit 123 is supplied with the setting signal, also by way of the resistor 107, and is connected by means of an inverting input 125 to a lower tap of the voltage divider 115, 117, 119. At low voltage values of the setting signal, an output 129, which is connected to a positive voltage by way of a resistor 127, of the first comparison circuit 111 is low and an output 133, which is connected to the positive voltage by way of a resistor 131, of the second comparison circuit 123 is high. At average voltage values of the setting signal, the output 129 of the first comparison circuit 111 is high and also the output 133 of the second comparison circuit 123, and at high voltage values of the setting signal the output 129 of the first comparison circuit 111 is high and the output 133 of the second comparison circuit 123 is low.

A voltage divider 135, 137, a tap of which is connected to an inverting input 139 of a third comparison circuit 141 and further to ground by way of a resistor 143, is connected between the outputs 129 and 133 of the comparison circuits 111, 123. A non-inverting input 145 of the third comparison circuit 141 is connected to a positive voltage of 6 V. An output 149, which is connected to a positive voltage by way of a resistor 147, of the third comparison circuit 141 is now high at low voltage values of the setting signal, low at average voltage values and high at high voltage values.

The output 129 of the first comparison circuit is connected to the base of a transistor 153 by way of a resistor 151, the output 149 of the third comparison circuit 141 to the base of a transistor 157 by way of a resistor 155 and the output 133 of the second comparison circuit 123 to the base of a transistor 161 by way of a resistor 159. The collectors of the transistors 153, 157 and 161, respectively, are connected to outputs 163, 165 and 167, respectively, of the threshold circuit 103 and produce a wave range switching signal at the inputs 7, 9 and 11, respectively, of the section 3. At low voltage values of the setting signal, the outputs 163 and 165 are low and the output 167 is high. At average voltage values the outputs 163 and 167 are low, the output 165 is high and at high voltage values the outputs 165 and 167 are low and the output 163 high.

The output 149 of the third comparison circuit 141 is further connected to a non-inverting input 169 of a fourth comparison circuit 171 and the output 133 of the second comparison circuit 123 to a non-inverting input 173 of a fifth comparison circuit 175. Inverting inputs 177 and 179, respectively, of the fourth and fifth comparison circuits, 171 and 175, respectively, is connected to the positive 6 V voltage. An output 181 of the fourth comparison circuit 171 is connected to a positive voltage by way of a series arrangement of resistors 183, 185, 187. The junction point of the resistors 183, 185 is connected to the output 101 of the threshold circuit 103 and the junction point of the resistors 185 and 187 is connected to an output 191 of the fifth comparison circuit 175 by way of a resistor 189.

The output 101 of the threshold circuit 103 is now low for low voltage values of the setting signal at its input 105, higher at average voltage values of the setting signal and still higher at high voltage values of the setting signal. The values of these three voltage levels at the output 101 are determined by the resistors 183, 185, 187, 189, these values being such that the subtracting circuit 95 supplies at its output 97 a tuning voltage which, at an increasing voltage value of the setting signal at the input 93 thereof, passes for each wave range through a value which varies from low to high, adapted to the limit values required for the wave range.

The setting circuit 45 forms part of a search tuning circuit which will now be described. The search tuning circuit has two bistable multivibrator circuits or flip-flops 193, 195, which serve as stores for a start or stop function and as search direction store. The flip-flops 193 195 are formed by NAND-gate circuits 197, 199 and 201, 203 which are fed back in pairs.

When, by briefly depressing a switch 205, a negative-going pulse is applied to the NOR-gates 201 and 199 via a network comprised of two resistors 207, 209 and a capacitor 211, the flip-flop 195 is set and the flip-flop 193 is reset. An output 213 of the flip-flop 195 now becomes high and also an output 215 of the flip-flop 193, another output 217 of which then becomes low. The outputs 213 and 217 of the flip-flops 195 and 193 are connected to inputs of a NAND-gate 219, the output of which becomes high. By way of a resistor network 221, 223 this output drives the base of a transistor 225 in response to which a sound channel 227 is switched-off, and, by way of a time constant network comprising a capacitor 229 and a resistor 231, this output adjusts an inverting input 233 of an amplifier 235 temporarily to the high condition, so that an output 237 thereof can temporarily no longer be influenced by other signals applied to the amplifier 235. This amplifier 235 is used to generate a stop signal which can now temporarily not be produced.

Via a diode 239, the output 215 renders a point 241 of the circuit high, independent of an AFC signal which is applied by way of a parallel arrangement of a resistor 243 and a capacitor 245 to this point 241 and originates from an output of an emitter follower 247, 249 which is controlled by an AFC detector 251, which is supplied with a picture intermediate frequency signal from the output 27 of the intermediate-frequency circuit 17.

By way of a resistor 253, the point 241 now adjusts an inverting input 225 of an amplifier 257 to the high condition relative to a non-inverting input 259 connected to a tap of a voltage divider 261, 263. An output 265 of the amplifier 257 now becomes low and, by way of a resistor 267, causes a transistor 269, which has an emitter resistor 271, to supply current by way of its collector to a series arrangement of a resistor 273 and a capacitor 275. In response thereto, the capacitor 275 is charged and the voltage on the outputs 43, 87, 89, which are further connected to the collector of transistor 269, increases. The receiver tuning now changes until a transmitter is received, as a result of which, when the transmitter signal has a sufficiently high amplitude, the input 233 of the amplifier 235 is rendered low via the output 25 of the intermediate frequency portion 17, an amplitude detection circuit 277 and an emitter follower 279, 281 the gain of which is adjusted by means of two resistors 283, 285.

The amplifier 235 has a non-inverting input 287 to which the AFC signal, originating from the emitter follower 247, 249, is applied by way of a network having a resistor 289 and a capacitor 291. A decreasing voltage in the AFC signal at the input 287 and a sufficiently low voltage at the input 233 of the amplifier 235 results in a negative-going stop signal at the output 237, which is connected to a positive voltage by way of a resistor 293, which signal resets the flip-flop 193 by way of a differentiating network 295, 297 and does not affect the set condition of the flip-flop 195 by way of an inverting amplifier 299 and a differentiating network 301, 303. The sound channel is switched on via the gate 219. The diode 239 is cut off and an AFC-signal, which is applied to the transistor 269 through the amplifier 257, becomes active in the point 241, as a result of which the charge of the capacitor 275 is just corrected thus that the circuit just remains tuned to the transmitter at which it has stopped. The current through the transistor 269 is now substantially equal to the current discharged by a further transistor 305 from the capacitor 275, this current being determined by a voltage divider having a resistor 307, a diode 308, and a resistor 309 to the base of the transistor 305 and by an emitter resistor 311.

From the base of the transistor 269, a series arrangement of a diode 312 and a resistor 313 is connected to a tap of a voltage divider 315, 317, which is connected between the output 97 of the subtracting circuit 95 and a positive supply voltage. Furthermore, the resistor 307 to the base of the transistor 305 and the emitter resistor 271 of the transistor 269 are also connected to this tap. When a search action is performed, a non-linear time-depending charge reverse of the capacitor 275 is obtained, caused by the fact that the charge-reversing current of the capacitor 275 now depends on the voltage across the capacitor 275. The change in tuning frequency becomes substantially linear because of this non-linearity during a search action. The resistor 273 has for its function to prevent instability of the control loop created by the feed-back from the tap of the voltage divider 315, 317. An advantage of the said non-linearity is that only one and the same time constant 229, 231 is sufficient to prevent a recurrent catching of the transmitter from which a search action has started.

A smoothing capacitor 319 at the output 97 of the tuning circuit and a negative feedback resistor 321 from that output 97 to the inverting input 99 of the subtracting circuit further ensure a stable tuning voltage at the output 97.

To start a search action into the direction of decreasing frequency a switch 323 may be briefly depressed, causing a negative-going pulse to be applied to the NAND-gates 197 and 203 by way of a network 325, 327, 329, causing the state of the flip-flop 193 to remain as it is and the flip-flop 195 to be reset, in response to which the output 213 becomes low which, by way of a diode 331, causes the input 255 of the amplifier 257 to become low and the output 265 thereof to become high, in response to which the transistor 269 no longer produces current and the transistor 305 withdraws charge from the capacitor 275. Suppressing the sound reproduction and preventing the recurrent catching of the transmitter from which a search action was started is effected in the same manner as described above for the other searching direction via the gate 219. When tuning stops at a received transmitter, a negative-going pulse is applied to the NAND-gate 201 via the amplifier 299 and the network 301, 303 to set the flip-flop 195 again. This stop signal is the result of a positive-going edge of the AFC signal at the input 287 of the amplifier 235 which coincides with a sufficiently low voltage at the input 233.

In order to be able to start a search action always from the same point after the supply voltage has been switched on, a circuit having a voltage divider comprised of a zener diode 331 and a resistor 333 which, through an inverting amplifier 335 and a diode 337, which is further connected to the positive voltage by way of a series resistor 339, supplies to a capacitor 341 a negative-going voltage which is applied to the NAND-gates 199 and 201. The outputs 213 and 215 then become high and the transistor 219 charges the capacitor 275 before the further supply voltages are sufficiently high to obtain a sufficiently strong transmitter signal at the outputs 25 and 27 of the intermediate frequency amplifier 17.

It will be clear that the tuning circuit according to the invention is also suitable for use in other types of receivers such as, for example, radio broadcast receivers.

The embodiment is provided with an electronic tuning circuit having a mark on the picture screen. Different tuning scales operating by means of measuring instruments or sequences of light-producing or light-dispersing elements may, of course, also be used. Alternatively, the mark may be generated on the picture screen in a different position than at its edge.

Instead of the signals mentioned in the above description, voltages or currents may alternatively be used depending on the further construction of the circuit.

In the embodiment the setting circuit is part of a search tuning circuit. This is not necessary. A manually adjustable voltage divider or a counter having a digital-to-analog converter may, for example, alternatively be used as the setting circuit, the automatic wave range change-over as well as the adaptation of the range limits of each wave range remaining operative. Also other types of search tuning circuits may, if so desired, be used.

The setting circuit and/or the subtracting circuit and/or the threshold circuit may, if so desired, be constructed with suitable converters to adapt them to the remaining portion of the circuit.

When a mark along the edge of the picture screen is used as the tuning scale, riders can be provided along that edge as a memory for the tuning position of desired transmitters, the vertical edges being more suitable than the horizontal edges of the picture screen in view of the lesser parallax owing to the glass thickness.

The obtention of the d.c. voltage to be applied to the input 99 of the subtracting circuit 95 and which has a different value for each wave range may, of course, be effected in different manners, for example by means of relays or by means of electronic elements other than comparison circuits.

What is claimed is:

1. A tuning circuit for providing a tuning signal to a tunable device, said device including a wave range change-over circuit, said tuning circuit comprising a setting circuit for generating a setting signal for consecutively tuning over a plurality of wave ranges, a threshold circuit, to which the said setting signal is applied, for providing a changeable d.c. voltage signal, which depends on the setting signal, said d.c. voltage signal having different, constant values corresponding, respectively, to each of said wave ranges and being switchable for each wave range at preselected amplitude levels of said setting signal by means of the threshold circuit, and further comprising a subtracting circuit responsive to said setting signal and said changeable d.c. voltage signal for providing said tuning signal.

2. A tuning circuit as claimed in claim 1, which further comprises an electrical tuning scale indicator controlled by the setting signal.

3. A tuning circuit as claimed in claim 2, characterized in that the setting circuit is non-linear in order to provide a substantially linear tuning scale indication.

4. A tuning circuit as claimed in claim 3, characterized in that the setting circuit is part of a search tuning circuit having a fixed time constant for AFC and stop signal suppression, respectively, at a start of a search tuning action.

5. A tuning circuit as claimed in anyone of the preceding claims 1 to 4, wherein the wave range changeover circuit is responsive to a signal combination from the threshold circuit for changing wave ranges.

* * * * *